(12) United States Patent
Delpech et al.

(10) Patent No.: US 7,378,692 B2
(45) Date of Patent: May 27, 2008

(54) INTEGRATED ELECTRONIC CIRCUIT COMPRISING SUPERPOSED COMPONENTS

(75) Inventors: Philippe Delpech, Meylan (FR); Christophe Regnier, St. Hilaire du Touvet (FR); Sebastien Cremer, Grenoble (FR); Stephane Monfray, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 82 days.

(21) Appl. No.: 11/412,270

(22) Filed: Apr. 27, 2006

(65) Prior Publication Data

US 2006/0189057 A1    Aug. 24, 2006

Related U.S. Application Data

(62) Division of application No. 10/850,040, filed on May 20, 2004, now Pat. No. 7,202,137.

(30) Foreign Application Priority Data

May 20, 2003   (FR) .................................. 03 06030

(51) Int. Cl.
*H01L 29/76*  (2006.01)
*H01L 29/94*  (2006.01)
*H01L 31/062* (2006.01)
*H01L 31/113* (2006.01)
*H01L 31/119* (2006.01)

(52) U.S. Cl. .................... 257/288; 257/296; 257/301; 257/E21.008; 257/E21.415; 257/E21.17; 257/E21.229; 257/E29.275

(58) Field of Classification Search ................ 257/288, 257/296, 301, 302, 347, 352, 646, 651, 760
See application file for complete search history.

(56) References Cited

U.S. PATENT DOCUMENTS

| | | | |
|---|---|---|---|
| 4,888,300 A | 12/1989 | Burton | |
| 5,438,015 A | 8/1995 | Lur | |
| 5,843,820 A * | 12/1998 | Lu | ............................. 438/243 |
| 5,943,581 A * | 8/1999 | Lu et al. | ..................... 438/386 |
| 5,972,758 A | 10/1999 | Liang | |
| 6,127,712 A | 10/2000 | Wu | |
| 6,245,636 B1 | 6/2001 | Maszara | |
| 6,468,877 B1 | 10/2002 | Pradeep et al. | |
| 7,202,137 B2 * | 4/2007 | Delpech et al. | ............. 438/386 |
| 2004/0124468 A1 | 7/2004 | Coronel et al. | |

OTHER PUBLICATIONS

French Preliminary Search Report dated Jan. 26, 2004 for French Application No. 03 06030.
Preliminary Search Report for European Application No. EP 04 29 1219 dated Oct. 31, 2005.

* cited by examiner

*Primary Examiner*—David Nhu
(74) *Attorney, Agent, or Firm*—Lisa K. Jorgenson; Jon A. Gibbons; Fleit Kain Gibbons Gutman Bongini & Bianco P.L.

(57) ABSTRACT

An integrated electronic circuit with at least at least one passive electronic component and at least one active electronic component. The passive electronic component is formed within an insulating material disposed on a substrate. The active component is formed within a volume of substantially single-crystal semiconductor material disposed on top of the passive component.

18 Claims, 3 Drawing Sheets

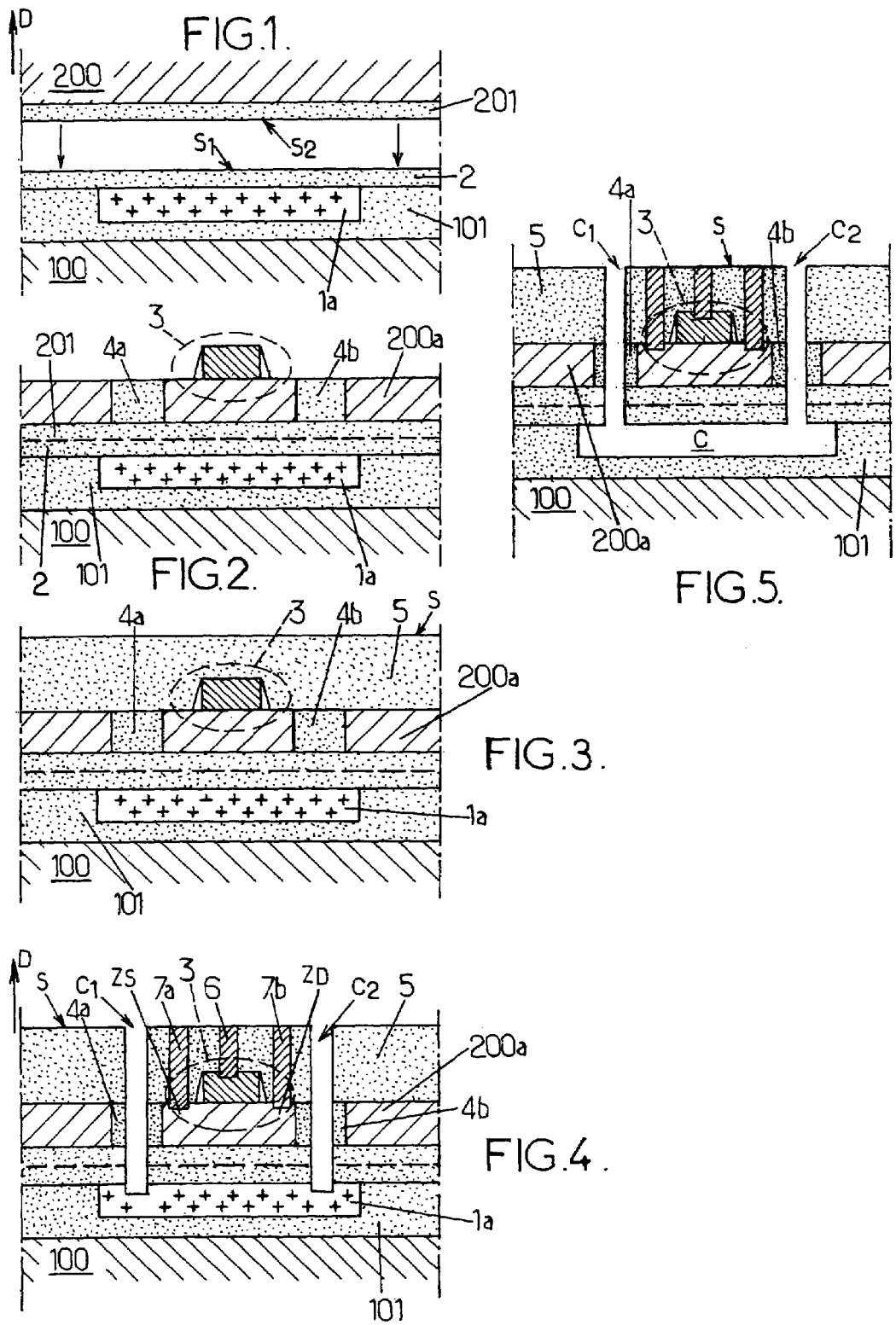

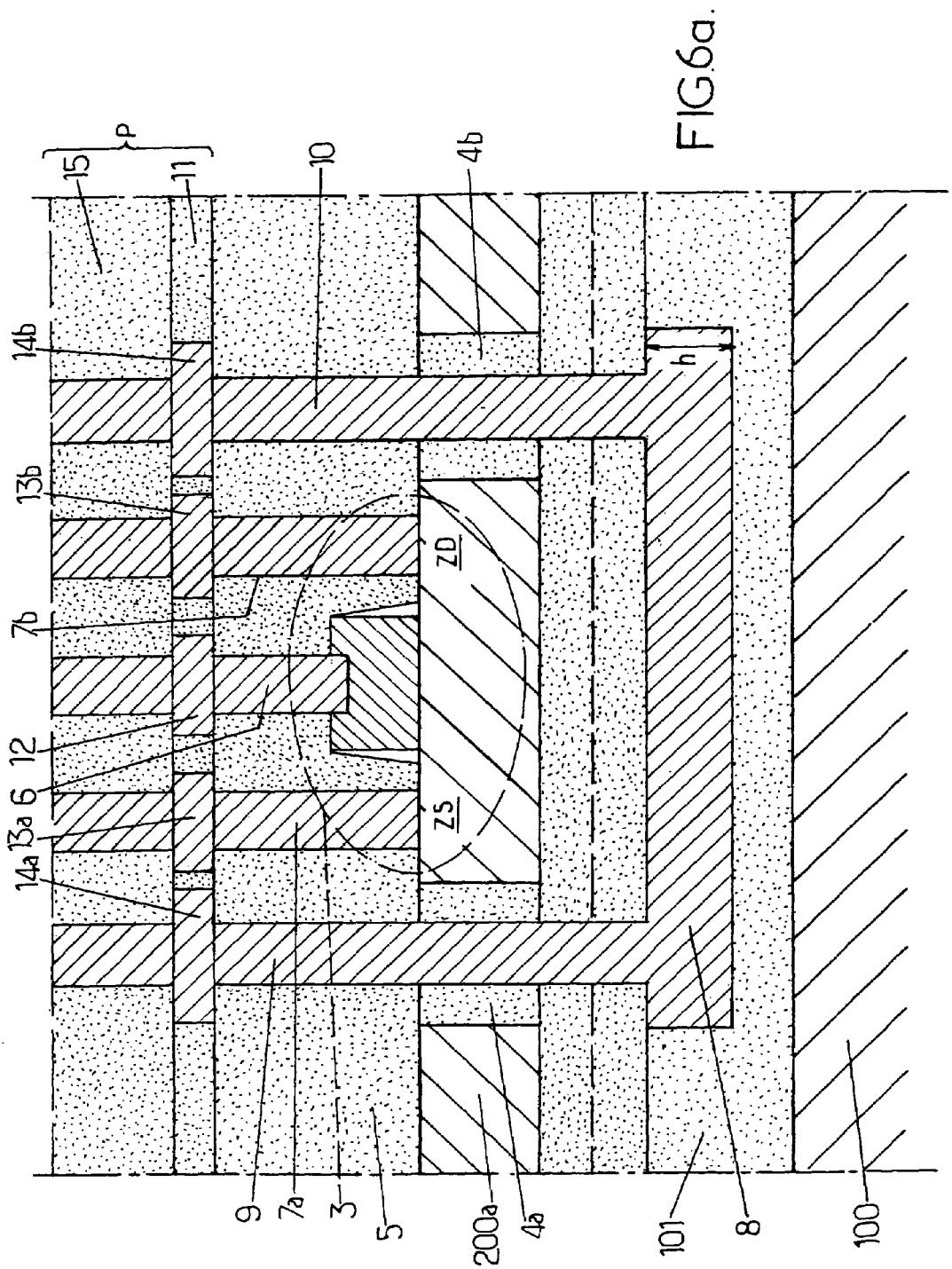

INTEGRATED ELECTRONIC CIRCUIT COMPRISING SUPERPOSED COMPONENTS

CROSS-REFERENCE TO RELATED APPLICATIONS

This application is a divisional of application Ser. No. 10/850,040, filed May 20, 2004, now U.S. Pat. No. 7,202,137, which is based upon and claims priority from French Patent Application No. 03 06030, filed on May 20, 2003 the entire disclosure of each which are herein incorporated by reference in their entirety.

FIELD OF THE INVENTION

The present invention generally relates to a process for producing an integrated electronic circuit and more specifically to an integrated electronic circuit comprising superposed electric components.

BACKGROUND OF THE INVENTION

Integrated electronic circuits generally comprise active components, such as transistors, produced on the surface of a semiconductor substrate. They also comprise layers of electrically insulating materials superposed on top of the surface of the substrate, within which layers metal tracks, constituting electrical connections between the active elements, are placed.

Furthermore, certain circuits currently produced include passive components, such as resistors, inductors or capacitors that are also placed within the layers of insulating materials. Typically, these components are produced in a form in which they are integrated into the circuit; they are produced during the formation of the superposed layers of insulating materials, by suitable deposition of specific materials.

However, certain passive components, particularly capacitors of high capacitance, have a large footprint because of their large size. It is then difficult to make the placing of these components within the layers of insulating materials compatible with the placement of the electrical connection tracks. To take an example, a capacitor may have a length of up to several hundred microns, depending on its capacitance. This footprint requires the size of the circuit substrate to be increased, so as to be able to place all the components and all the necessary connection tracks within the layers of insulating materials that cover the substrate. This therefore results in an increase in cost of the integrated circuit, this increase being particularly burdensome in respect of large-scale diffusion in such circuits.

Accordingly, a need exist to overcome the shortcomings and drawbacks of the prior art with the size reduction of capacitors in integrated electronic circuits.

SUMMARY OF THE INVENTION

Briefly in accordance with the present invention, provided is a process for The invention relates to a process for producing an integrated electronic circuit, comprising:

formation of a volume of temporary material on a substrate;

formation of a first electronic component above the volume of temporary material, on an opposite side of the volume of temporary material from the substrate;

formation of at least one access shaft between an access surface of the circuit and the volume of temporary material;

removal of at least part of the temporary material via the access shaft so as to hollow out at least a portion of the volume of temporary material; and formation of a second electronic component in the hollowed-out portion of the volume of temporary material by introducing at least one material via the access shaft.

Thus, according to the invention, placing the second component between the substrate and the first component does not reduce the available volume above the first component for distributing the electrical connection tracks. It is therefore unnecessary to increase the size of the circuit substrate in order to place the second component together with the tracks in the integrated circuit.

The process of the invention therefore comprises the use of a temporary material placed at the location of the second component, between the substrate and the first component. The first component is produced and then the second electronic component is formed using the shaft for access to the temporary material.

Thanks to this chronological order of producing the first and then the second components, the second component is not impaired by a treatment of the circuit needed to produce the first component, although being located between the substrate and the first component.

According to the preferred method of implementing the process of the invention, the formation of a first electronic component comprises a wafer bonding of a substantially single-crystal semiconductor material to the circuit, on an opposite side of the volume of temporary material from the substrate. At least part of the first component may then be produced within the substantially single-crystal material.

Furthermore, the process may include, between formation of a volume and the formation of a first electronic component, a formation of a volume of electrically insulating material placed above the volume of temporary material relative to the substrate, in such a way that the volume of electrically insulating material is located in the final circuit between the first component and the second component. The first component is thus electrically isolated from the substrate and from the second component.

The first component may comprise an active component and the second component may comprise a passive component. In accordance with the meanings signed by those skilled in the art to active component and passive component terminologies, an active component may for example be a transistor and a passive component may for example be a resistor, an inductor or a capacitor.

The invention also relates to an integrated electronic circuit comprising a substrate, at least one active electronic component and one passive electronic component that are supported by the substrate, characterized in that the passive component is placed between the substrate and the active component.

According to a preferred embodiment of the invention, at least part of the active component is placed in a volume of substantially single-crystal semiconductor material. The active component may then have noteworthy operating characteristics, such as electrical conduction characteristics, for example by virtue of the crystal structure of the material in which the part of the active component is produced.

Moreover, the circuit may also include a volume of electrically insulating material placed between the active component and the passive component. Such an insulating volume offers the well-known advantages of SOI (Silicon On Insulator)-type integrated circuits, especially in terms of reducing leakage currents.

BRIEF DESCRIPTION OF THE DRAWINGS

The subject matter, which is regarded as the present invention, is particularly pointed out and distinctly claimed in the claims at the conclusion of the specification. The foregoing and other features, and advantages of the present invention will be apparent from the following detailed description taken in conjunction with the accompanying drawing in which:

FIGS. 1 to 5 and 6a illustrate various steps in a process for producing a resistor according to the invention.

DESCRIPTION OF THE PREFERRED EMBODIMENTS

Figure 6B:
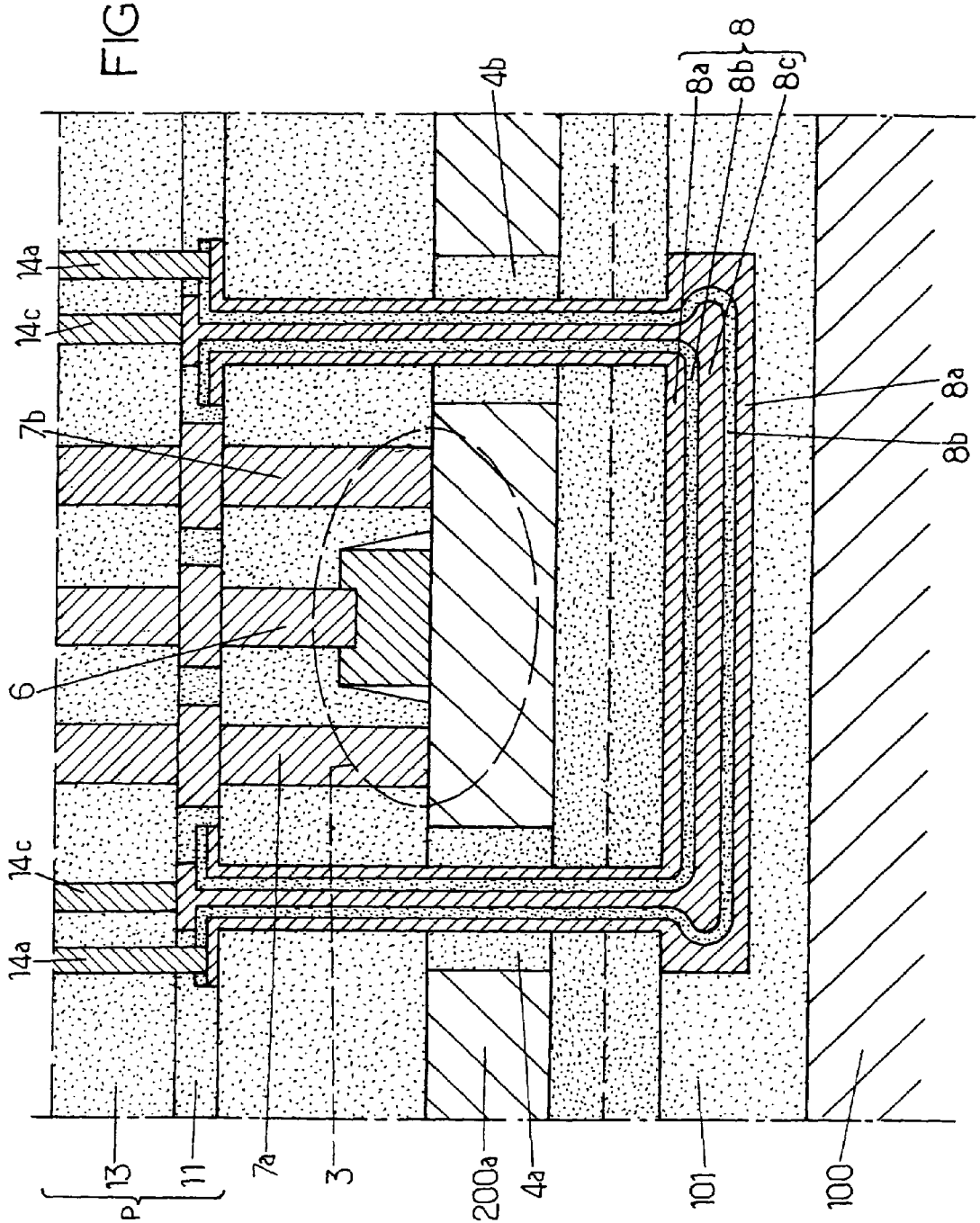
FIG. 6b illustrates a capacitor produced according to the invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In these figures, for the sake of clarity, the dimensions of the various parts of the components shown are not drawn to scale. These figures are cross-sectional views of a substantially planar substrate, considered in a plane perpendicular to the surface of the substrate. The substrate is placed in the lower part of each figure and D denotes a direction perpendicular to the surface of the substrate, directed towards the top of the figures. In what follows, the terms "on", "under", "lower" and "upper" are used with reference to this orientation. Moreover, in all the figures, identical references correspond to identical elements.

In what follows, the elementary steps of the process for fabricating an integrated electronic circuit that are known to those of average skilled in the art will not be described in detail. A description is directed to a succession of steps that allows an integrated electronic circuit to be produced using the process of the invention.

As first illustrative example of the invention, described below, the first component is a MOSFET transistor, which constitutes the active component, and the second component is an electrical resistor, which constitutes the passive component.

In FIG. 1, a substrate 100, for example made of silicon, is covered with a layer of insulating material 101, for example silica ($SiO_2$). The thickness of the layer 101 is, for example, around 200 nanometres. Using a lithographic mask (not shown), a volume 1a is hollowed out by etching the layer 101. The depth of the volume 1a is, for example, 100 nanometers in the direction D. The lithographic mask is then removed and the volume 1a is filled with a temporary material such as, for example, germanium or a silicon-germanium alloy. The temporary material is chosen so as to be able to be removed subsequently in a selective manner relative to the layer 101. The upper surface of the circuit is polished in order to remove any excess temporary material above the upper surface of the layer 101. A layer 2, preferably made of silica, is deposited on the circuit. The upper surface S1 of the layer 2 is strictly planar and devoid of any foreign element.

A second substrate 200, of doped single-crystal silicon, is also covered with a silica layer 201. The layer 201 may be formed by thermal oxidation of the silicon of the substrate 200. The surface S2 of the layer 201 thus formed is also strictly planar.

According to the known process of wafer bonding, the surfaces S1 and S2 are brought into contact with each other. The substrates 100 and 200 are then heated above 800° C. while being pressed against each other. Chemical bonds are formed between the materials of the layers 2 and 201, at the contact surfaces S1 and S2. The substrates 100 and 200 are thus joined together.

Part of the substrate 200 is then removed, so as to leave above the substrate 100 only a film 200a of substrate 200, with a thickness of about 50 nanometers in the direction D (FIG. 2). The eliminated part of the substrate 200 is removed, for example by polishing starting from a face of the substrate 200 on the opposite side from the substrate 100. The removal is continued by dry etching so as to obtain an upper surface of the film 200a that is devoid of polishing residues. By virtue of the wafer bonding process used, the film 200a is made of single-crystal silicon of the same crystalline quality as the initial substrate 200.

Two isolating sheath portions 4a and 4b are formed in the film 200a. The portions 4a and 4b may, for example, be formed using the known process of forming shallow trench isolations (STIs).

One or more MOSFET transistors 3 are also formed in the film 200a, in line with the volume 1a, with respective gates placed above the film 200a using the known MOS technology. For the sake of clarity, only a single transistor 3 is shown in the figures, but a large number, even several thousands, of transistors 3 may be formed beside one another in the film 200a in line with the volume 1a. At least some of the transistors 3 may be located between the isolating sheath portions 4a and 4b, parallel to the upper surface of the film 200a.

Regions of the film 200a are then implanted, on either side of each gate, so as to form the source region ZS and drain region ZD of the corresponding transistor 3, by doping the silicon. The dopants are then activated, which may be accomplished, in a known manner, by heating the circuit up to a temperature of about 900° C.

A layer of a coating material 5 is deposited on the circuit. The layer 5 may be obtained by chemical vapor deposition (CVD) of silica, for example starting with a TEOS (tetraethyl orthosilicate) precursor. The upper surface S of the layer 5 is polished so as to be planar and perpendicular to the direction D. The configuration of the circuit obtained is shown in FIG. 3.

By anisotropic dry etching, in the direction D and in the opposite direction, two access shafts C1 and C2 and, for each transistor 3, three contacts 6, 7a and 7b are formed (FIG. 4). To do this, one or more successive etching plasmas are directed against the surface S via apertures in lithographic masks (not shown). For each transistor 3, the contact 6 extends between the surface S and the gate of the transistor. The contacts 7a and 7b extend between the surface S and the source region ZS and the drain region ZD, respectively, of the transistor. The three contacts 6, 7a and 7b are then filled with conducting material, such as tungsten or titanium nitride, so as to form an electrical gate connection, an electrical source connection and an electrical drain connection, respectively, for each transistor 3.

The apertures in the lithographic masks, that define the positions of the upper sections of the shafts C1 and C2 in the plane of the surface S, are located in such a way that the shafts C1 and C2 pass through the sheath portions 4a and 4b respectively, without being in contact with the film 200a.

A liquid solution for selectively etching the temporary material of the volume 1a is then introduced via the shafts C1 and C2. If the temporary material is germanium or a silicon-germanium alloy, a solution that is both oxidizing and acid may be used, which does not degrade the silica of the layers 101, 2, 201 and 5, nor the portions 4a and 4b. The temporary material of the volume 1a is etched isotropically, being removed by dissolving in the solution. The volume 1a is thus hollowed out so as to form a cavity C (FIG. 5).

Alternatively, the temporary material may be removed by dry isotropic etching, using a plasma that penetrates as far as the volume 1a via the shafts C1 and C2.

To form a resistor in the volume 1a, an electrically conducting material is introduced into the cavity C via the shafts C1 and C2 (FIG. 6a). Preferably, the conducting material is formed in the cavity C by chemical vapor deposition (CVD). To do this, the circuit substrate is heated. A gas containing volatile metal precursors, of the organometallic type or of the chloride type for example, is then brought into contact with the surface S. The precursors penetrate the shafts C1 and C2 and thermally decompose on contact with the walls of the cavity C, forming the conducting material. The cavity C is thus filled in order to form the conducting volume 8.

The conducting material may, for example, be titanium nitride (TiN), tantalum nitride (TaN), tungsten (W), cobalt (Co) or any metal or conducting compound or alloy compatible with the deposition process used. The resistance of the electrical resistor may be modified by selecting the conducting material and by adapting the distance between the shafts C1 and C2.

The conducting material is deposited simultaneously in the cavity C and in the access shafts C1, C2. The cross section of each shaft C1, C2 is determined so that each shaft C1, C2 is not closed before the cavity C is entirely filled. Complete filling of the cavity C is obtained, for a given cross section of the shafts C1 and C2, only if the two shafts are not too far apart. If the cavity C has a large dimension parallel to the surface of the substrate, it may then be necessary to provide additional access shafts regularly placed along this dimension. The inventors have found that, for access shafts having a circular cross section with a diameter of about 150 nanometers, two neighboring shafts do not have to be separated by a distance greater than 10 to 20 times the height h of the cavity C parallel to the direction D. Under these conditions, the cavity C and the shafts C1 and C2 are completely filled. The volume 8 filled with conducting material constitutes the resistor, and the shafts C1 and C2 constitute two electrical connections 9 and 10 that each connect one end of the resistor. They are electrically isolated from the source ZS and drain ZD regions of the transistors 3 by the sheath portions 4a and 4b.

The upper surface of the circuit is again polished, in order to remove any conducting material deposited thereon. The production of the circuit is then continued in a manner known per se. In particular, an upper circuit portion P may be placed above the resistor. The portion P may comprise, in particular, insulating layers 11 and 15, within which intermediate volumes 12, 13a, 13b, 14a and 14b of conducting material are produced. The intermediate volumes 12, 13a, 13b, 14a and 14b constitute pads for electrical contact with the connections 6, 7a, 7b, 9 and 10, respectively.

As second illustrative example of the invention, FIG. 6b shows a capacitor obtained from the configuration of the circuit corresponding to FIG. 5. A first electrically conducting material is introduced into the cavity C via the shafts C1 and C2. The first conducting material is, for example, titanium nitride, tungsten, aluminum, copper or any conducting compound metal or metal alloy compatible with the process used. As in the case of the above resistor, a CVD deposition process may be used. The first conducting material is thus deposited on the internal walls of the cavity C and of the shafts C1 and C2 in the form of a continuous layer 8a. The deposition is halted before the cavity C and the shafts C1 and C2 are completely filled. Similarly, a continuous layer 8b of insulating dielectric is formed in the cavity C and in the shafts C1 and C2 on the layer 8a. The dielectric of the layer 8b may be, for example, silica ($SiO_2$), alumina ($Al_2O_3$), titanium oxide ($TiO_2$), tantalum oxide ($Ta_2O_5$), hafnium oxide ($HfO_2$) or any other oxide or nitride. Finally, a layer 8c of a second electrically conducting material, that may be identical to the first electrically conducting material, but not necessarily so, is formed in the cavity C and in the shafts C1 and C2 on the layer 8b. The layers 8a, 8b and 8c form a capacitor 8, the layer 8a of which constitutes the external electrode and the layer 8c of which constitutes the internal electrode surrounded by the external electrode. The capacitance of the capacitor formed may be modified by adapting the dimensions of the initial volume 1a parallel to the surface of the substrate 100.

If the desired capacitance of the capacitor is low, a single shaft for access to the cavity C may be sufficient for introducing the two conducting materials and dielectric into the cavity C, while still obtaining layers 8a, 8b and 8c that cover all of the internal walls of the cavity C.

Production of the circuit may be continued by forming a circuit portion P that comprises electrical contact pads 14a and 14c that are matched to the configuration of the capacitor 8.

Among the advantages of the invention that emerge from the illustrative examples described above, the following may be mentioned:

the source, channel and drain of the transistor 3 are produced in a film of single-crystal material;

the silica layers 2 and 201, which adhere to each other upon wafer bonding, also provide electrical insulation between the transistor 3 and the lower part of the circuit that comprises the passive component 8 and the substrate 100;

the conducting materials of the passive component 8, which in general may be impaired by heating to a temperature above about 500-600° C., are not subjected to the heating for activating the dopants in the regions ZS and ZD of the transistor 3; and the electrical connections formed in the access shafts, and which connect the passive component 8 to the circuit portion P located on the opposite side of the active component 3 from the substrate 100, are surrounded, over a portion of these connections, by isolating sheath portions 4a and 4b. Thus, these connections are electrically isolated from the film of single-crystal material.

Many variants may be introduced into the circuit and its production process that have been described in detail above. In particular, the film 200a transferred by wafer bonding may be replaced with a layer of semiconductor material obtained by epitaxy on exposed portions of the surface of the substrate 100.

Another variant consists in initially forming the volume 1a by hollowing it out in the silicon substrate 100. The substrate 100 may then be made electrically insulating around the thus hollowed-out volume 1a in various ways. In particular, the walls of the hollowed-out volume 1a may be oxidized or they may be covered with a layer of an insulating material. The temporary material is then deposited in the volume 1a thus isolated from the silicon material of the substrate 100. The process then continues in exactly the same way as that described above.

Although a specific embodiment of the present invention has been disclosed, it will be understood by those having skill in the art that changes can be made to this specific embodiment without departing from the spirit and scope of the present invention. The scope of the present invention is not to be restricted, therefore, to the specific embodiment, and it is intended that the appended claims cover any and all such applications, modifications, and embodiments within the scope of the present invention.

What is claimed is:

1. An integrated electronic circuit comprising:
   a substrate;
   at least one active electronic component; and
   at least one passive electronic component;
   at least one electrical connection, connecting the passive electronic component to a circuit portion located on an opposite side of the active electronic component from the substrate;
   wherein the active electronic component and the passive electronic component are supported by the substrate and wherein the passive electronic component is disposed between the substrate and the active electronic component.

2. The integrated electronic circuit according to claim 1, wherein at least part of the active electronic component is placed in a volume of substantially single-crystal semiconductor material.

3. The integrated electronic circuit according to claim 1, further comprising:
   a volume of electrically insulating material disposed between the active electronic component and the passive electronic component.

4. The integrated electronic circuit according to claim 2, further comprising:
   a volume of electrically insulating material disposed between the active electronic component and the passive electronic component.

5. The integrated electronic circuit according to claim 1, wherein the electrical connection is surrounded, over a portion of the electrical connection, by an isolating sheath portion.

6. The integrated electronic circuit according to claim 2, further comprising:
   at least one electrical connection, connecting the passive electronic component to a circuit portion located on an opposite side of the active electronic component from the substrate, wherein the electrical connection is surrounded, over a portion of the electrical connection, by an isolating sheath portion.

7. The integrated electronic circuit according to claim 3, further comprising:
   at least one electrical connection, connecting the passive electronic component to a circuit portion located on an opposite side of the active electronic component from the substrate, wherein the electrical connection is surrounded, over a portion of the electrical connection, by an isolating sheath portion.

8. The integrated electronic circuit according to claim 4, further comprising:
   at least one electrical connection, connecting the passive electronic component to a circuit portion located on an opposite side of the active electronic component from the substrate, wherein the electrical connection is surrounded, over a portion of the electrical connection, by an isolating sheath portion.

9. The integrated electronic circuit according to claim 1, further comprising at least two electrical connections for electrically connecting the passive electronic component to a circuit portion located on an opposite side of the active electronic component from the substrate, wherein the passive electronic component has a height h and a minimum distance between two electrical connections is not more than twenty times the height h.

10. The integrated electronic circuit according to claim 1, wherein the active electronic component is a MOSFET transistor.

11. The integrated electronic circuit according to claim 1, wherein the passive electronic component is at least one of a resistor and a capacitor.

12. An integrated electronic circuit comprising:
    a substrate with an insulating material disposed thereon;
    at least one passive electronic component formed within the insulating material disposed on the substrate;
    a volume of substantially single-crystal semiconductor material disposed on top of the passive electronic component;
    at least one active electronic component formed in the volume of substantially single-crystal semiconductor material; and
    an isolating coating disposed on top of the active electronic component, forming a top surface on an opposite side of the active electronic component from the substrate with at least a first electrical connection formed therethrough for electrically connecting the passive electronic component to the top surface and at least a second electrical connection formed therethrough for electrically connecting the active electronic component to the top surface.

13. The integrated electronic circuit of claim 12, further comprising:
    an isolating sheath porting surrounding at least a portion of the first electrical connection for connecting the passive electronic component.

14. The integrated electronic circuit according to claim 12, comprising at least two first electrical connections formed through the insulating coating for electrically connecting the passive electronic component to the top surface, wherein the passive electronic component has a height h and a minimum distance between two first electrical connections is not more than twenty times the height h.

15. The integrated electronic circuit according to claim 12, wherein the active electronic component is a MOSFET transistor.

16. The integrated electronic circuit according to claim 12, wherein the passive electronic component is at least one of a resistor and a capacitor.

17. The integrated electronic circuit according to claim 1, wherein the circuit portion includes a plurality of electrical contact pads formed thereon and the electrical connection is connected to at least one of the electrical contact pads.

18. An integrated electronic circuit comprising:
    a substrate with an insulating material disposed thereon;
    at least one passive electronic component formed within the insulating material disposed on the substrate;
    a volume of substantially single-crystal semiconductor material disposed on top of the passive electronic component;
    at least one active electronic component formed in the volume of substantially single-crystal semiconductor material; and
    an isolating coating disposed on top of the active electronic component, with a plurality of electrical contact pads formed on top surface located on an opposite side of the active electronic component from the substrate with at least a first electrical connection formed therethrough for electrically connecting the passive electronic component to at least one of the electrical contact pads on the top surface and at least a second electrical connection formed therethrough for electrically connecting the active electronic component to the at least one of the electrical contact pads on the top surface.

* * * * *

UNITED STATES PATENT AND TRADEMARK OFFICE
CERTIFICATE OF CORRECTION

| | | |
|---|---|---|
| PATENT NO. | : 7,378,692 B2 | Page 1 of 1 |
| APPLICATION NO. | : 11/412270 | |
| DATED | : May 27, 2008 | |
| INVENTOR(S) | : Philippe Delpech et al. | |

It is certified that error appears in the above-identified patent and that said Letters Patent is hereby corrected as shown below:

Please make the following correction:

On title page item [75]

From "Sebastien Cremer Grenoble" (FR) to -- Sebastien Cremer Sassenage (FR) --

Signed and Sealed this

Twenty-ninth Day of July, 2008

JON W. DUDAS
*Director of the United States Patent and Trademark Office*